United States Patent
Eun

[11] Patent Number: 5,933,452
[45] Date of Patent: Aug. 3, 1999

[54] TIMING INTERPOLATOR IN DIGITAL DEMODULATOR

[75] Inventor: Myung-Su Eun, Seoul, Rep. of Korea

[73] Assignee: Daewoo Electronics Co., Ltd., Seoul, Rep. of Korea

[21] Appl. No.: 08/916,203

[22] Filed: Aug. 22, 1997

[30] Foreign Application Priority Data

Aug. 23, 1996 [KR] Rep. of Korea ...................... 96-35234

[51] Int. Cl.$^6$ ...................................................... H03H 7/30
[52] U.S. Cl. ........................... 375/232; 375/232; 375/350; 364/723; 364/724.011; 364/724.19
[58] Field of Search ..................... 375/234, 232, 375/326, 340, 350, 229; 364/723, 724.011, 724.1, 724.11, 724.19; 333/18, 28 R

[56] References Cited

U.S. PATENT DOCUMENTS

| | | | |
|---|---|---|---|
| 5,159,338 | 10/1992 | Takashasji | 341/61 |
| 5,398,029 | 3/1995 | Tomaya et al. | 364/724.1 |
| 5,481,568 | 1/1996 | Yada | 375/340 |
| 5,512,895 | 4/1996 | Madden et al. | 364/724.1 |

Primary Examiner—Chi H. Pham
Assistant Examiner—Emmanuel Bayard
Attorney, Agent, or Firm—Pillsbury Madison & Sutro LLP

[57] ABSTRACT

A timing interpolator for re-controlling a symbol timing in a digital demodulator for converting a received analog signal to a digital signal is disclosed. The timing interpolator comprises an address generator for inputting M number of fractional intervals between 0 to 1 at each clock, and generating addresses from the fractional intervals; a memory for storing sine function values corresponding to the M number of fractional intervals, and outputting sine function values corresponding to the addresses from the address generator; a tap-coefficient calculator for receiving the filter index, the fractional intervals, and the sine function values, to calculate a tap-coefficient; and a digital filter having L+1 number of taps to filter an input signal by using the calculated tap-coefficient obtained from the tap-coefficient generator, and outputting the filtered signal. By using this structure, the timing interpolator stores M number of sine function values in the memory according to the variation of the filter index, the fractional interval, and the fractional interval instead of (L+1)×M number of tap-coefficients, such that the interpolator's memory decreases by as much as 1/(L+1) by using the stored sine function values to directly calculate the tap-coefficients.

4 Claims, 4 Drawing Sheets

TIMING INTERPOLATOR IN DIGITAL DEMODULATOR

BACKGROUND OF THE INVENTION

1. Field of the Invention

The present invention relates to a timing recovery circuit in a digital demodulator for demodulating received modulated signal by a digital method, and more particularly, to a timing interpolator for directly calculating tap-coefficients by reading sine function values at each clock after storing M number of sine function values in a memory instead of (L+1)×M number of tap-coefficients, when (L+1) number of filter tap and M number of phase value are used in the demodulating process.

2. Description of the Prior Art

In digital communication system, a receiver samples transmitted analog signal in a predetermined sampling clock converting it into a digital signal. A carrier signal having frequency and phase corresponding to modulators used in a transmitter is recovered from the digital signal, and a demodulation is performed by using the recovered carrier signal to recover an original information signal. In a timing recovery circuit, an exact sampling clock, which affects the efficiency of the receiver, is determined.

In digital modems, when sampling is synchronized with data symbol, a feedback loop for controlling the sampling clock by adjusting the phase of local clock or a feedforward loop utilizing regenerated timing wave from the received modulation signal is used, as in an analog modem. When the sampling is not synchronized with the data symbol, namely if the sampling clock is not related to the symbol timing the timing is controlled by an interpolation. By interpolating between unsynchronized samples. an exact strobe values in the modem are generated, similar to the strobe values generated when the sampling is synchronized with the symbol.

FIG. 1 shows a block diagram of a conventional digital timing recovery unit, that performs the timing recovery using a feedback loop. The digital timing recovery unit comprises a sampling clock generator 11, a first sampler 12, an interpolator 13, a data filter 14, a timing error detector 15, a loop filter 16, and a controller 17.

In FIG. 1, the sampling clock generator 11 generates a sampling clock in period Ts, in which alising does not occur. The first sampler 12 generates signal X(mTs), which samples a band limited input signal X(t) according to the sampling clock, and outputs it. The interpolator 13 generates and outputs an interpolant y(kTi) for interpolating the signal X(mTs) in interpolation interval Ti. The data filter 14 filters the interpolant y(kTi) to output the final strobe data. The timing error detector 15 detects a timing error from the strobe data. The loop filter 16 removes a noise component of the detected timing error. The controller 17 controls an operation of the interpolator 13 by using the filtered timing error to perform the exact timing recovery.

Referring to FIG. 2, a digitization of the interpolator 13 will be described in detail. FIG. 2 shows a block diagram for explaining an operation of the interpolator 13 in FIG. 1. The interpolator 13 comprises a digital/analog (D/A) converter 21, an interpolating filter 22, and a second sampler 23. In FIG. 2, a sampled signal X(mTs) from a first sampler 12 shown in FIG. 1 is converted into an analog signal x(t) by the D/A converter 21. The converted analog signal x(t) is filtered by the interpolating filter 22 to generate an interpolator signal y(t). The interpolator signal y(t) is resampled by the second sampler 23 to be outputted as an interpolant y(kTi). Here, the sampling interval of the second sampler 23, namely the interval between the interpolants Ti is provided from the controller 17 in FIG. 1.

An output y(t) from the interpolating filter 22 is expressed by the following expression 1, when an impulse response of the interpolating filter 22 is $h_1(t)$.

Expression 1.

$$y(t) = \sum_m x(mTs)h_I(t - mTs).  \qquad \text{Expression 1}$$

Here, the original signal x(t) does not coincide with the filtered signal y(t). A new sample is obtained by resampling the output y(t) at t=kTi in the second sampler 23, namely interpolant y(kTi), which is expressed by the following expression 2.

Expression 2.

$$y(kTi) = \sum_m x(mTs)h_I(kTi - mTs). \qquad \text{Expression 2}$$

In the above expression 2, if the input signal x(m), the impulse response $h_1(t)$ of the interpolating filter 22, the sampling interval mTs of the first sampler 12, and the sampling interval kTi of the second sampler 23 are known, the interpolant can be calculated digitally from the above expression 2.

To define the variables used in the expression 2, when m is a signal index, a filter index i, basic point index $m_k$, fractional interval $\mu_k$ can be calculated by the following expression Expression 3.

Signal index: m $$\text{Signal index: } m \qquad \text{Expression 3}$$

$$\text{filter index: } i = \text{int}\left[\frac{kTi}{Ts}\right] - m$$

$$\text{basic point index: } m_k = \text{int}\left[\frac{kT}{Ts}\right]$$

$$\text{fractional interval: } \mu_k = \frac{kTi}{Ts} - m_k.$$

In the above expression 3, int[z] refers to the largest integer not exceeding z, where $0 \leq \mu_k \leq 1$. Here, the fractional interval $\mu_k$ is very important for adjusting the resampling interval of the interpolator 13, and it is calculated in the controller 17 to be provided to the second sampler 23.

Meanwhile, the variations in the fractional interval $\mu_k$ in respect to the relationship between the intervals Ts and Ti of the first sampler 11 and second sampler 23, respectively, are examined. First, when Ti cannot fractionally reduce with Ts, the fractional interval $\mu_k$ will be irrational and will change for each interpolant. Second, if Ti is assumed to be very nearly equal to Ts, as if the sampling is nearly synchronized, then the fractional interval $\mu_k$ changes very slowly; if it is quantized, it remains constant over many interpolants. Third, if Ts fractionally reduces with Ti, but not equal Ti, then the fractional interval $\mu_k$ repeats periodically. The expression 2 can be alternatively expressed into the following expression 4 through the substitution by the variables from the expression 3.

Expression 4.

$$y(kTi) = y[(m_k + \mu_k)Ts] = \sum_{i=l1}^{l2} x[(mk - i)Ts]hI[(i + \mu_k)Ts] \quad \text{Expression 4}$$

A digital interpolation in a modem can be achieved by the above expression 4. The impulse response value $h_I[(i+\mu_k)Ts]$ of the interpolating filter 22 is a filter tap-coefficient.

The interpolator 13 can be comprised of a Finite Impulse Response (FIR) having a delay shift register, a multiplier, and an adder. The interpolator of the system operating in a high speed stores a calculated filter tap-coefficient in a separate memory; for example, a ROM, and reads filter tap-coefficients in time units, namely the clock units, to perform the interpolation. Here, the tap-coefficients of the interpolation are obtained by a polynomial filter or a polyphase filter. For example, in the polyphase filter having (L+1) number of taps, when M number of phase values per one tap are used, the total of (L+1)×M number of tap coefficients are obtained. Accordingly, the number of tap-coefficients stored in the memory is (L+1)×M, when the filter index i is a variable in the impulse response, the number of tap is (L+1), and the number of fractional interval $\mu_k$ is M.

As described above, since the number of tap in the interpolating filter is related to the transmission speed of a signal or to the operating speed of a system, the number of calculated filter tap coefficients increases when the system is operated in high speed. Accordingly, there is a need to increase the memory capacity for storing the tap-coefficients.

SUMMARY OF THE INVENTION

In view of the foregoing, it is an object of the present invention to provide a timing interpolator for directly calculating tap-coefficients by reading sine function values at each clock after storing M number of sine function values in a memory instead of (L+1)×M number of tap-coefficients, when the number of filter tap and phase value is (L+1) and M, respectively.

In order to achieve the above object, the present invention provides a timing interpolator in a digital demodulator, comprising:

an address generator for inputting M number of fractional intervals between 0 to 1 at each clock, and generating addresses from the fractional intervals;

a memory for storing M number of sine function values corresponding to the M number of fractional intervals, and outputting sine function values corresponding to the addresses from the address generator;

a tap-coefficient calculator for receiving the filter index, the fractional intervals, and the sine function values to calculate tap-coefficients; and a digital filter for having L+1 number of taps to filter the input signal by using the calculated tap-coefficients obtained in said tap-coefficient calculator, and outputting the filtered signal.

The timing interpolator having the above structure stores M number of sine function values according to the variation of the fractional interval instead of (L+1)×M number of tap-coefficients, according to the variation of the filter index and the fractional interval such that the interpolator's memory decreases by as much as 1/(L+1) by using the stored sine function values to directly calculate the tap-coefficients.

BRIEF DESCRIPTION OF THE DRAWINGS

The above and other objects, features, and advantages of the present invention will be apparent from the following detailed description of the preferred embodiments of the invention in conjunction with the accompanying drawings, in which.

DESCRIPTION OF THE PREFERRED EMBODIMENT

Reference will now be made in detail to the present invention, examples of which are illustrated in the accompanying drawings. Wherever possible. the same reference numbers will be used throughout the drawings to refer to the same or like parts.

Figure 3:
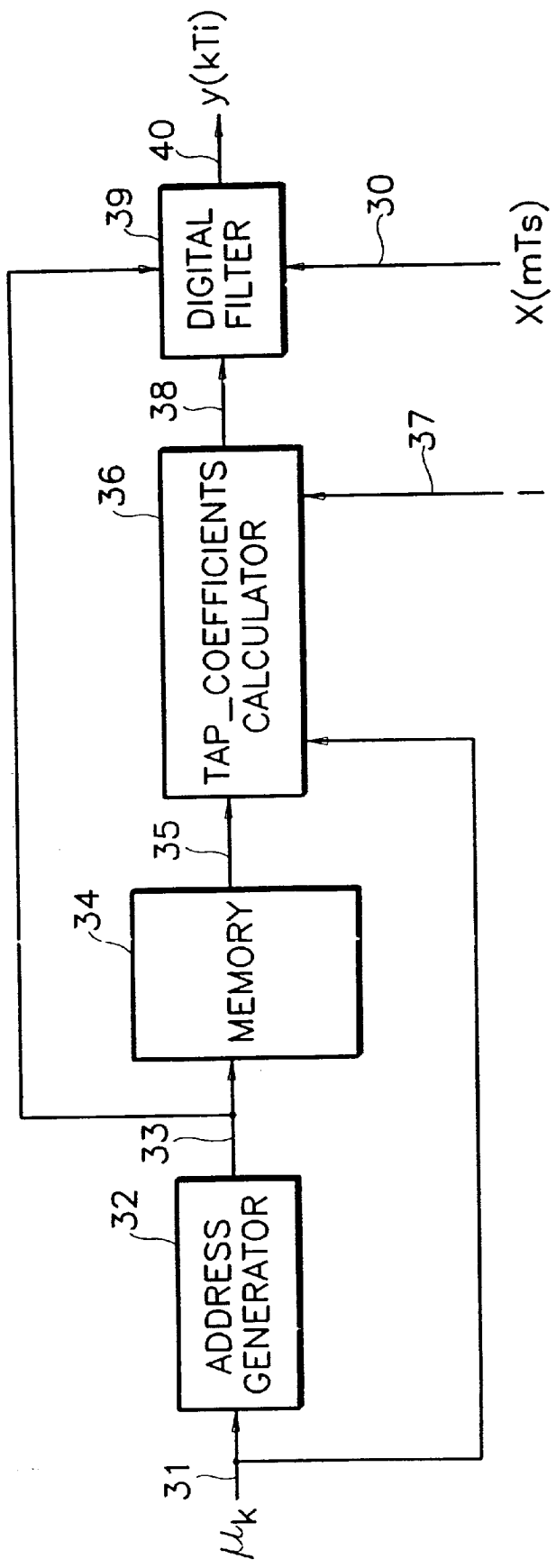
FIG. 3 is a block diagram illustrating a timing interpolator according to the present invention.

FIG. 3 shows a block diagram of a timing interpolator according to the preferred embodiment of the present invention. The timing interpolator comprises an address generator 32, a memory 34; for example a ROM, a tap coefficient calculator 36, and a digital filter 39; for example a FIR filter. The address generator 32 receives fractional intervals $\mu_k$ 31 at each clock to generate an address signal 33. The memory 34 stores M number of sine function values according to values of the fractional intervals $\mu_k$, and outputs the sine function value 35 corresponding to the memory address 33. The tap-coefficient calculator 36 receives sine function values 35 outputted from the memory 34, the fractional intervals $\mu_k$, and the filter index i, and calculates and outputs tap-coefficients 38. The digital filter 39 filters the input signals 30 according to the received tap-coefficients 38 and address signals 33. and outputs interpolants 40.

Figure 4:
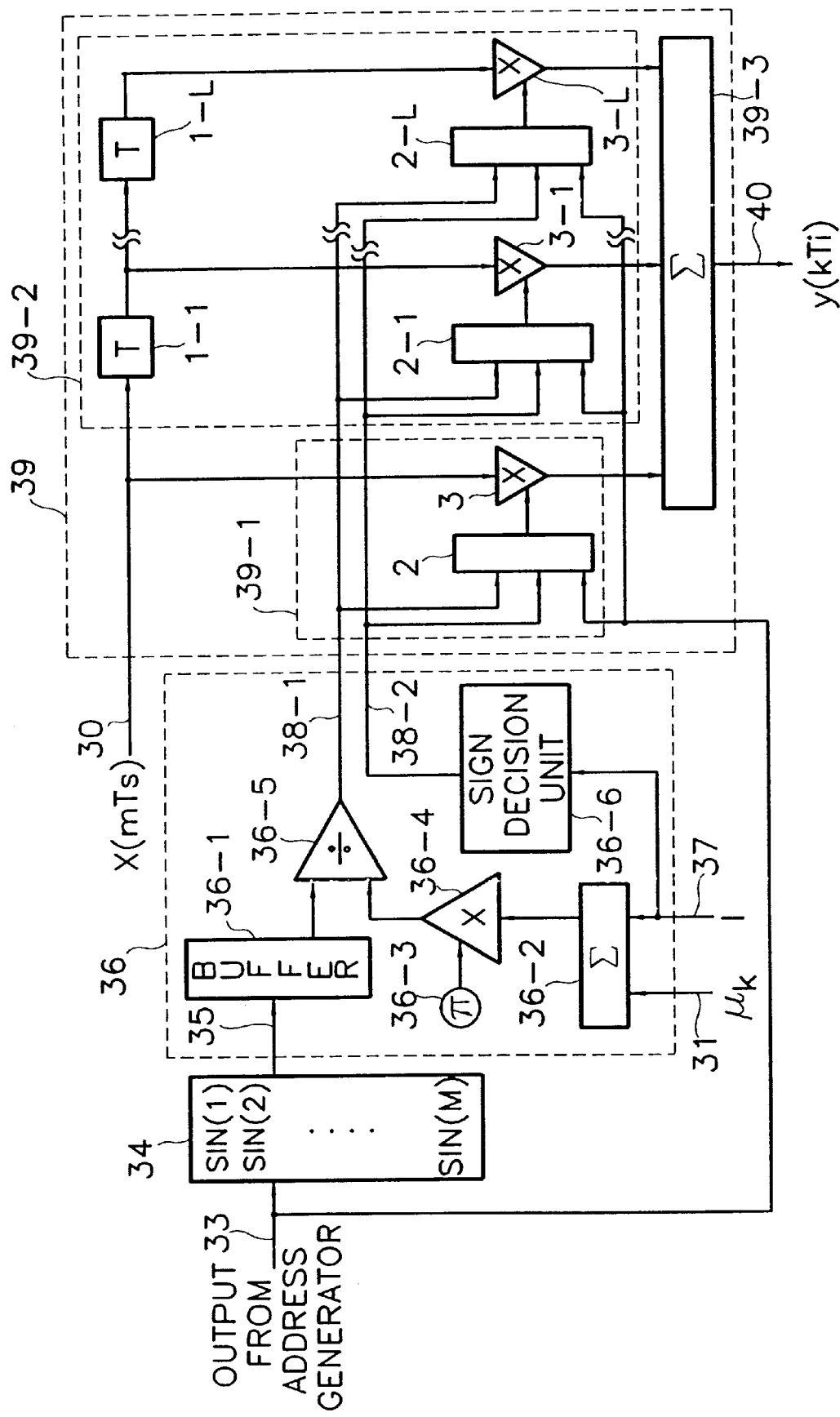
FIG. 4 is a detailed block diagram of the timing interpolator illustrated in FIG. 3.

FIG. 4 is a detailed block diagram of the timing interpolator illustrated in FIG. 3, and particularly it shows the memory 34, the tap-coefficient calculator 36, and the digital filter 39. Here, the tap-coefficient calculator 36 comprises a sine buffer 36-1 for temporally latching outputs from the memory 34, an adder 36-2 for adding the fractional interval $\mu_k$ 31 to the filter index i; 37, a multiplier 36-4 for multiplying a value outputted from the adder 36-2 by $\pi$ value stored in a memory, for example a ROM 36-3, a divider 36-5 for outputting an absolute value 38-1 of the tap-coefficient by dividing the sine function value 35 outputted from the sine buffer 36-1 into a value outputted from the multiplier 36-4, and a sign decision unit 36-6 for receiving the filter index i 37 and deciding a sign 38-2 of the tap-coefficient. The digital filter 39 comprises a basic-filtering unit 39-1, an auxiliary filtering unit 39-2, an adder 39-3, for adding values from each multiplier 3, 3-1, to 3-L, and for outputting an interpolant 40 (a filtered input signal 30). The basic-filtering unit 39-1 comprises a tap-coefficient buffer 2 for receiving an absolute value 38-1 of tap-coefficient, the sign 38-2 of tap-coefficient, and the address signal 33, and outputs the tap-coefficient 38. The basic-filtering unit 39-1 also comprises a multiplier 3 for multiplying the input signal by the tap-coefficient from the tap-coefficient buffer 2. The auxiliary filtering unit 39-2 comprises a plurality of groups, the groups being connected in parallel. Each group comprises: a first delay latch unit 1-1 for delaying the input signal 30 as much as one clock; a first tap-coefficient register unit 2-1 for inputting the absolute value 38-1 of tap-coefficient, the sign 38-2 of tap-coefficient, and the address signal 33 to output the tap-coefficient 38; and a first multiplier 3-1 for multiplying an output value from the first delay latch unit 1-1 by an output value from the first tap-coefficient register unit 2-1.

Now, referring to FIGS. 3 and 4, an operation of the interpolator will be described in detail.

Figure 2:
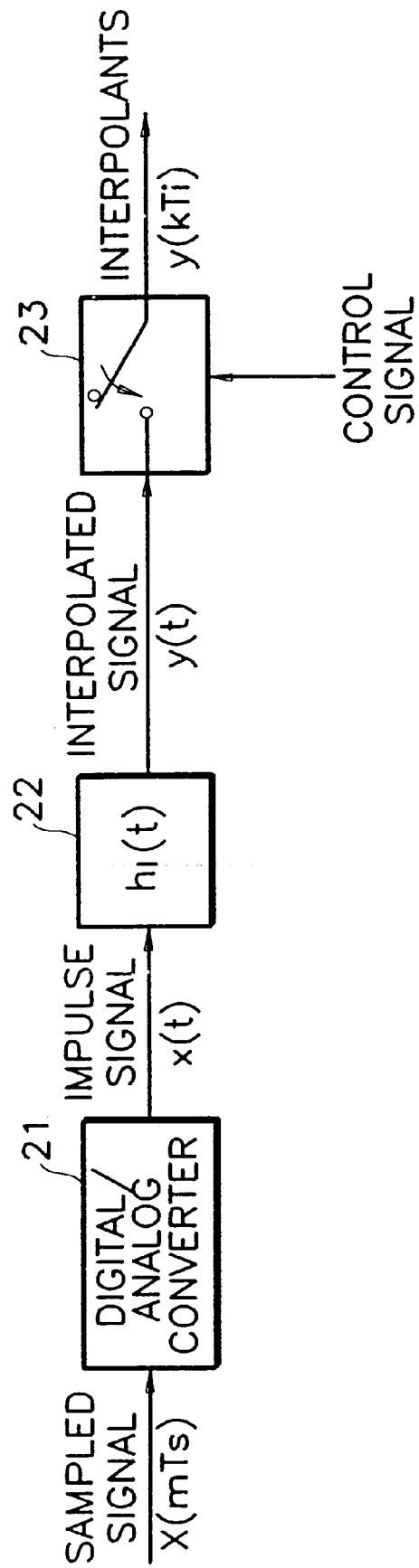
FIG. 2 is a block diagram illustrating an interpolator of FIG. 1.

The interpolation filter 22 of FIG. 2, having an impulse response, $$h_I(t) = \frac{\sin \pi T/Ts}{\pi T/Ts}$$

can be constructed with a FIR digital filter having an impulse response, $$h_I[(i+\mu_k)]Ts = \frac{\sin(i+\mu_k)\pi Ts}{(i+\mu_k)\pi Ts}.$$

Figure 1:
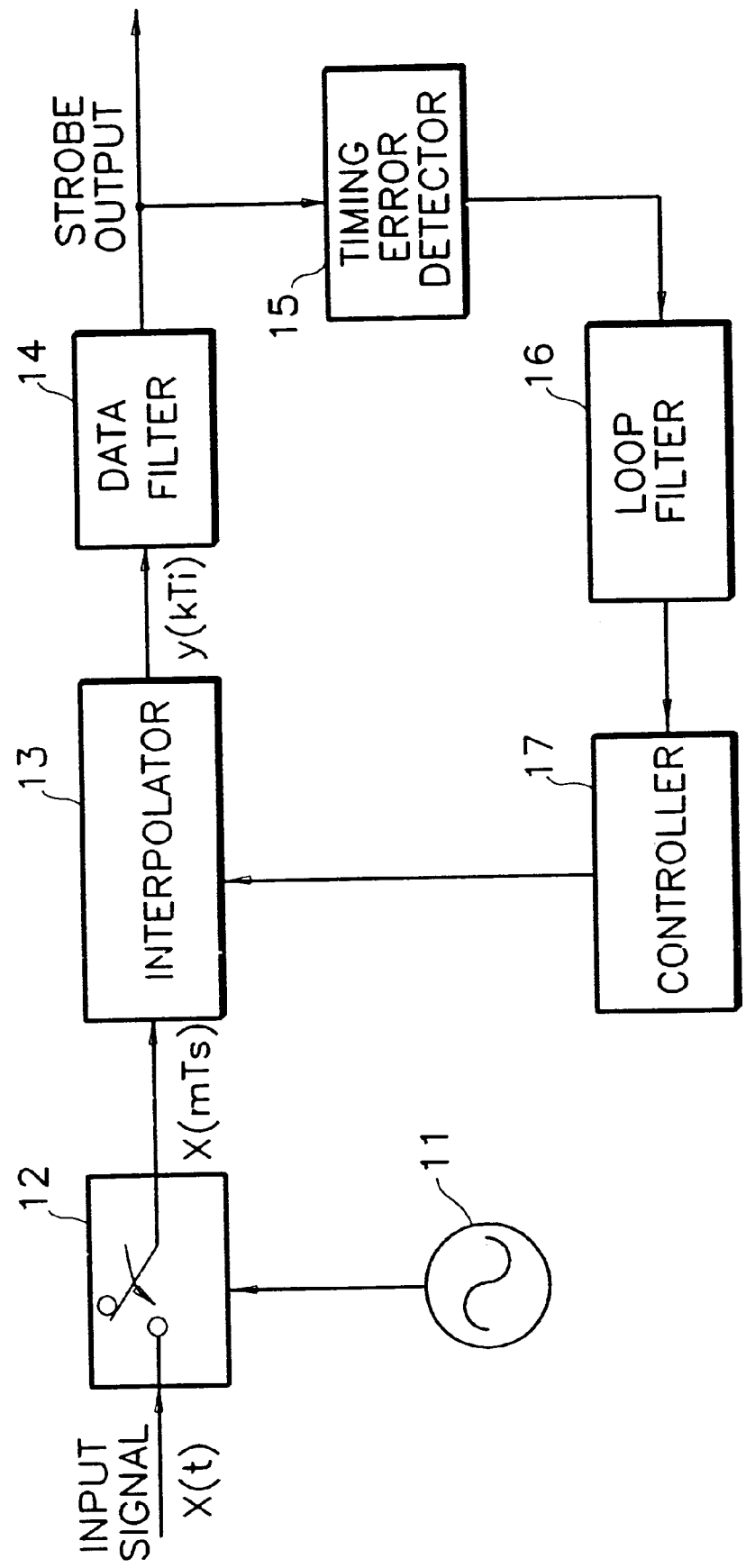
FIG. 1 is a block diagram of a conventional timing recovery circuit in a digital demodulator.

Here, the filter index i is a positive integer or a negative integer, and it is determined by the number of taps in the FIR filter (here, assume that the number of taps is L+1). The fractional interval $\mu_k$, as shown in FIG. 1, is a fraction between 0 to 1 to re-control the sampling intervals outputted from the controller 17. For example, if the filter indices i are −4, −3, −2, −1, 0, 1, 2, 3 and the fractional interval is the same, the following relationships 1 and 2 are derived, since the sine function is an even function.

Relationship 1.

$$\sin(-4+\mu_k)\pi = \sin(-2+\mu_k)\pi = \sin(0+\mu_k)\pi = \sin(2+\mu_k)\pi$$

Relationship 2.

$$\sin(-3+\mu_k)\pi = \sin(-1+\mu_k)\pi = \sin(1+\mu_k)\pi = \sin(3+\mu_k)\pi$$

In comparing the relationships 1 and 2, absolute values obtained by the two relationships are equal to each other, but the sine function value of the relationship 1 is a positive number, whereas the sine function value of the relationship 2 is a negative number. Accordingly, the variation of the filter index i is connected with the sign of the tap-coefficient, and the absolute value of the tap-coefficient is related to the variation of the fractional interval $\mu_k$. Namely, after storing the sine function value according to the fractional interval $\mu_k$ in the memory 34, the present invention provides the result of calculated impulse response (the absolute value of the tap-coefficient) by using the sine function value read from the memory 34, and signs of the corresponding absolute value to the digital filter 39.

The address generator 32 receives the fractional intervals having M number of fractional values between 0 to 1 at each clock, and quantizes them to be outputted as an address signal 33. Here, the fractional intervals 31 is used to define filter coefficient sample values.

The memory 34 stores M number of sine function values SIN(1) through SIN(M) according to the fractional interval values, and outputs the sine function value 35 corresponding to the address signal 33 outputted from the address generator 32. The sine function value read from the memory 34 is outputted to the sine buffer 36-1 of the tap-coefficient calculator 36.

The tap-coefficient calculator 36 receives the sine function value 35, the fractional interval $\mu_k$, and the filter index i from the memory 34, calculates and outputs the tap-coefficient.

In the tap-coefficient calculator 36, the adder 36-2 receives the fractional interval 31 and the filter index, adds and outputs the result to the multiplier 36-4. The multiplier 36-4 reads the π value stored in the ROM 36-3, multiplies it by the value outputted from the adder 36-2, and outputs the result to divider 36-5. The divider 36-5 divides the value outputted from the sine buffer 36-1 into the value outputted from the multiplier 36-4, and outputs the result as an absolute value of the tap-coefficient.

The sign decision unit 36-6 receives the filter index value i 37 to decide the sign 38-2 of the tap-coefficient. The tap-coefficient corresponds to a sinc function, the value obtained by dividing the sine function value $\sin(i+\mu_k)\pi$ into $(i+\mu_k)\pi$. At this time, the tap-coefficient has an opposite sign to the sign of the corresponding sine function value when the filter index value is a positive number, whereas it has the same sign as the sign of the corresponding sine function value when the filter index value is a negative number. The conditions for determining the sign are as follows: "+" is outputted when the filter index value is 0; "+" is outputted when the filter index is also a positive and even number; "−" is outputted when the filter index is a positive and odd number; "−" is outputted when the filter index is also a negative and even number; and "+" is also outputted when the filter index is a negative and odd number The digital filter 39 receives both the tap-coefficient 38 from the tap-coefficient calculator 36 and the address signal 33. In respect to these inputs, it generates and outputs the interpolant 40, a result of the filtered input signal 30. The interpolant 40 is used to calculate the strobe data necessary for the data and timing recovery in the data filter 14 of FIG. 1.

In the basic-filtering unit 39-1 of the digital filter 39, the tap-coefficient buffer 2 receives the absolute value 38-1 of the tap-coefficient, the sign 38-2 of the tap-coefficient, and the address signal 33. With respect to these inputs it generates the tap-coefficient 38. The multiplier 3 multiplies the input signal 30 by the tap-coefficient 38 from the tap-coefficient buffer 2, and outputs the result to the adder 39-3.

In the auxiliary filter 39-2, L number of delay latch units 1-1 to 1-L are directly connected for outputting each input signal 30, after delaying it from 1 to L number of clock. L number of tap-coefficient registers 2-1 to 2-L receive the absolute value 38-1 of the tap-coefficient, the sign 38-2 of the tap-coefficient, and the address signal 33 for generating and storing the tap-coefficients.

L number of multipliers 3-1 to 3-L multiplies the L number of outputs from the delay latch unit 1-1 to 1-L by the L number of outputs from the tap-coefficient registers 2-1 to 2-L, and provides the L number of multiplied values to the adder 39-3. For example, the first multiplier 3-1 multiplies the delayed signal (the input signal X(mTs); 30 delayed as much as one clock in the first delay latch unit 1-1) by the tap-coefficient outputted from the first tap-coefficient register 2-1, and outputs the multiplied value to the adder 39-3. Similarly, for the rest of the multipliers, the L number of multipliers multiply the delayed signal (the input signal X(mTs); 30 delayed as much as L number of clock in the $L_{th}$ delay latch unit 1-L) by the tap-coefficient outputted from the $L_{th}$ tap-coefficient register 2-L, and outputs the multiplied value to the adder 39-3.

The adder 39-3 adds outputs from each multiplier 3, 3-1, to 3-L, and outputs the added values as the interpolants y(kTi); 40.

As described above, the timing interpolator of the present invention stores M number of sine function values according to fractional intervals inputted at each clock in the memory, and directly calculates, (L+1) number of tap-coefficients. In comparison with the prior art storing (L+1)×M number of tap-coefficients according to the variations of the filter index and the fractional interval, the interpolator's memory decreases by as much as 1/(L+1) times by using the stored sine function values to directly calculate the tap-coefficients.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. A timing interpolator in a digital demodulator, comprising:

an address generator for inputting M number of fractional intervals between 0 to 1 depending on a clock, and generating an address signal from the fractional intervals;

a memory for storing M number of sine function values corresponding to the M number of fractional intervals, and outputting the sine function values corresponding to the address signal from the address generator;

a tap-coefficient calculator for receiving a filter index, the fractional intervals, and the sine function values to calculate tap-coefficients; and a digital filter for having L+1 number of taps to filter an input signal by using the tap-coefficients obtained in said tap-coefficient calculator, and outputting a filtered input signal, wherein said digital filter comprises:

a basic-filtering unit comprising:

a tap-coefficient buffer for generating and outputting the tap-coefficients according to an absolute value and a sign of the tap-coefficients, and the address signal; and a multiplier for multiplying the input signal by the tap-coefficients outputted from said tap-coefficient buffer; and an auxiliary filtering unit comprising:

L number of delay latch units for outputting signal which has been delayed by 1 to L number of the clock;

L number of tap-coefficient registers for receiving the absolute value of the tap-coefficients, the sign of the tap-coefficients, and the address signal, for generating and storing the tap-coefficients;

L number of multipliers for multiplying the outputs from said L number of delay latch units by outputs from said L number of tap-coefficient registers, respectively, and outputting L number of multiplied values; and means for adding th e output values from said L number of multipliers of said auxiliary filtering unit, and outputting the obtained value as an interpolant.

2. The timing interpolator of claim 1, wherein said tap-coefficient calculator comprises:

an absolute value generator for generating an absolute value of the tap-coefficients according to the sine function values read from said memory, the fractional intervals, and the filter index; and a sign decision unit for deciding a sign of the tap-coefficients by the filter index.

3. The timing interpolator of claim 2, wherein said absolute value generator comprises:

a sine buffer for temporarily storing the sine function values outputted from said memory;

an adder for adding the fractional intervals and filter index;

a multiplier for multiplying a value outputted from said adder by • value; and a divider for outputting the absolute value of the tap-coefficients by dividing the sine function values from said sine buffer into a value outputted from said multiplier.

4. The timing interpolator of claim 2, wherein said sign decision unit outputs a sign "•" when the filter index is 0; a positive and an even number; or a negative and an odd number, whereas it outputs a sign "•" when the filter index is a positive and an odd number; or a negative and an even number.

* * * * *